United States Patent [19]

Walck

[11] Patent Number: 4,967,397
[45] Date of Patent: Oct. 30, 1990

[54] DYNAMIC RAM CONTROLLER

[75] Inventor: Jeffrey A. Walck, Lebanon, N.J.

[73] Assignee: Unisys Corporation, Blue Bell, Pa.

[21] Appl. No.: 351,883

[22] Filed: May 15, 1989

[51] Int. Cl.[5] .................. G11C 7/00; G11C 8/00; G06F 9/00
[52] U.S. Cl. .......................... 365/222; 365/230.03; 364/900
[58] Field of Search ............ 365/222, 230.03; 364/200 MS File, 900 MS File

[56] References Cited

U.S. PATENT DOCUMENTS

| | | | |
|---|---|---|---|
| 4,601,018 | 7/1986 | Baum et al. | 365/222 X |
| 4,649,511 | 3/1987 | Goula | 365/222 X |
| 4,663,735 | 5/1987 | Novak et al. | 364/900 |
| 4,691,303 | 9/1987 | Churchward et al. | 365/230.03 |
| 4,725,945 | 2/1988 | Kronstadt et al. | 365/230.03 |
| 4,796,232 | 1/1989 | Hoase | 365/230.05 X |
| 4,797,850 | 1/1989 | Amitai | 364/900 |
| 4,803,621 | 2/1989 | Kelly | 365/230.03 |
| 4,823,324 | 4/1989 | Taylor et al. | 365/230.03 |
| 4,870,622 | 9/1989 | Aria et al. | 365/230.03 |
| 4,887,240 | 12/1989 | Garverick et al. | 365/222 |

Primary Examiner—Joseph A. Popek
Assistant Examiner—Michael A. Whitfield
Attorney, Agent, or Firm—Albert B. Cooper; Mark T. Starr

[57] ABSTRACT

A DRAM controller wherein the outputs of a 74F538 integrated circuit provides RAS signals to the banks of a DRAM array, respectively, where the 74F538 is located at the array. A microprocessor utilizing the array provides appropriate memory address signals, a refresh request signal and a RAS timing signal. A PAL16L8B responsive to the memory address, refresh request signal and RAS timing signal encodes the memory address into a digital RAS signal having fewer bits than the number of memory banks. The digital RAS signal represents the selected bank for a memory access cycle. The digital RAS signal is conveyed in parallel on a bus coupling the PAL to the 538. The PAL generates an enable signal in response to the RAS timing signal to enable the 538 during memory access cycles. During memory access cycles, the 538 decodes the digital RAS signal to enable one of the outputs thereof in accordance therewith. The P input of the 538 receives a refresh pulse generated by the PAL in response to the refresh request signal. When the refresh pulse is active and the 538 is disabled, all of the outputs thereof switch polarity so as to effect a refresh cycle.

16 Claims, 3 Drawing Sheets

FIG. 1.
PRIOR ART

DYNAMIC RAM CONTROLLER

BACKGROUND OF THE INVENTION

1. Field of the Invention

The invention relates to dynamic random access memories (DRAM), particularly with respect to the controller circuitry therefor.

2. Description of the Prior Art

DRAM technology is commonly utilized to implement the memory requirements for present day digital computers such as microprocessors. Generally, such memories are arranged in banks wherein a word location in a bank is accessed during a memory read or write cycle by row and column address signals. Thus, when addressing a memory location, the microprocessor provides a memory address that selects a memory bank as well as providing the row and column addresses for the desired location. In conventional DRAM design, the microprocessor provides the row address followed by the column address to a single address port serving the DRAM arrays. The row address is entered into the memory circuitry by a Row Address Strobe (RAS) issued by the microprocessor and similarly the column address is entered by a Column Address Strobe (CAS). Each bank of the memory has a RAS line input for strobing the row address signals therein. The bank selection portion of the memory address determines to which bank the RAS pulse is directed. DRAM arrays tend to be extensive having numerous memory banks requiring a large number of RAS lines.

The data stored in a DRAM cell requires periodic refreshing in order to maintain the data. A row of cells is refreshed by applying the row address to the memory address port while activating the RAS line. Traditionally, during a refresh cycle of a DRAM memory, corresponding rows in all of the banks are simultaneously refreshed by inputting the appropriate row address and simultaneously enabling all of the RAS lines. The rows of the banks are sequentially refreshed during sequentially performed refresh cycles by inputting sequential row addresses while simultaneously enabling the RAS lines for each row address. Thus, it is appreciated that for read/write memory access cycles, one of the plurality of RAS lines is enabled in order to access the appropriate bank. During memory refresh cycles, all of the RAS lines are simultaneously enabled.

In the configuration of the prior are invention described herein, the microprocessor provides the time multiplexed row and column addresses, the RAS and CAS pulses as well as a refresh request signal. In alternative microprocessor configurations, additional multiplexing and timing circuitry is utilized to provide some or all of these signals.

In order to perform the above-described functions, a DRAM controller is utilized. The controller includes decoding and bank selection logic that decodes the memory address into one of a plurality of bank selection lines which in turn provide the RAS signals, respectively. The bank selection lines are passed through refresh generating circuitry comprising logical OR functions responsive to the refresh request and RAS pulse usually derived from the microprocessor timing signals in order to individually energize the RAS lines during read/write memory access cycles and simultaneously energize the RAS lines during refresh cycles. In the prior art arrangement, a RAS signal bus containing one RAS line for each memory bank connects the DRAM controller to the DRAM bank array.

Thus, it is appreciated that circuitry for controlling the large amounts of dynamic RAM has traditionally involved the switching of a large number of RAS signals by the DRAM controller circuitry for the purpose of operating multiple banks of DRAM, one at a time. The RAS signals are mutually exclusive during read/write cycles enabling only one memory bank for any given memory read or write operation. However, for the periodically required refresh operation, all banks, or alternatively large groups of banks, are simultaneously enabled. Thus, DRAM circuits traditionally require that the RAS signals be driven individually one at a time, or that all be driven simultaneously. A considerable amount of circuitry and a large number of RAS signal conductors on the RAS signal bus connecting the controller to the memory array are required to perform these functions. Because of the large number of components required and the excess size of the electrical bus carrying the RAS signals that connects the memory array with the controller circuitry, a concomitant disadvantage of excess cost and physical space required for the circuit is also suffered. The cost of the individual circuits may also be excessive because of the requisite large number of electrical interconnections or I/0 pins from any integrated circuit designed to drive the DRAMs. The excessive number of circuits required in the prior art to perform the described functions also adversely impacts the speed of the circuit because the critical timing signals experience excessive propagation delays.

SUMMARY OF THE INVENTION

The shortcomings of the prior art are overcome by a DRAM controller having an encoder that encodes the plurality of RAS lines into a digital signal having a number of bits smaller than the number of RAS lines. A RAS signal bus transmits the digital signal to a decoder circuit that reconverts the digital signal into the selectively energizable plurality of RAS lines. The RAS lines are applied, respectively, to enable the banks of the memory. The decoder circuit includes a polarity input that controls the polarity of the decoder circuit outputs. The polarity input is normally utilized to control the circuit to implement positive or negative logic. The refresh pulse is applied from the encoder along the bus to the polarity input of the decoder circuit in order to effect a refresh cycle. Preferably, a 538 type integrated circuit chip is utilized for the decoder circuit.

BRIEF DESCRIPTION OF THE DRAWINGS

FIG. 1 is a schematic block diagram of a prior art architecture for implementing a DRAM controller.

DESCRIPTION OF THE PREFERRED EMBODIMENT

Figure 1:
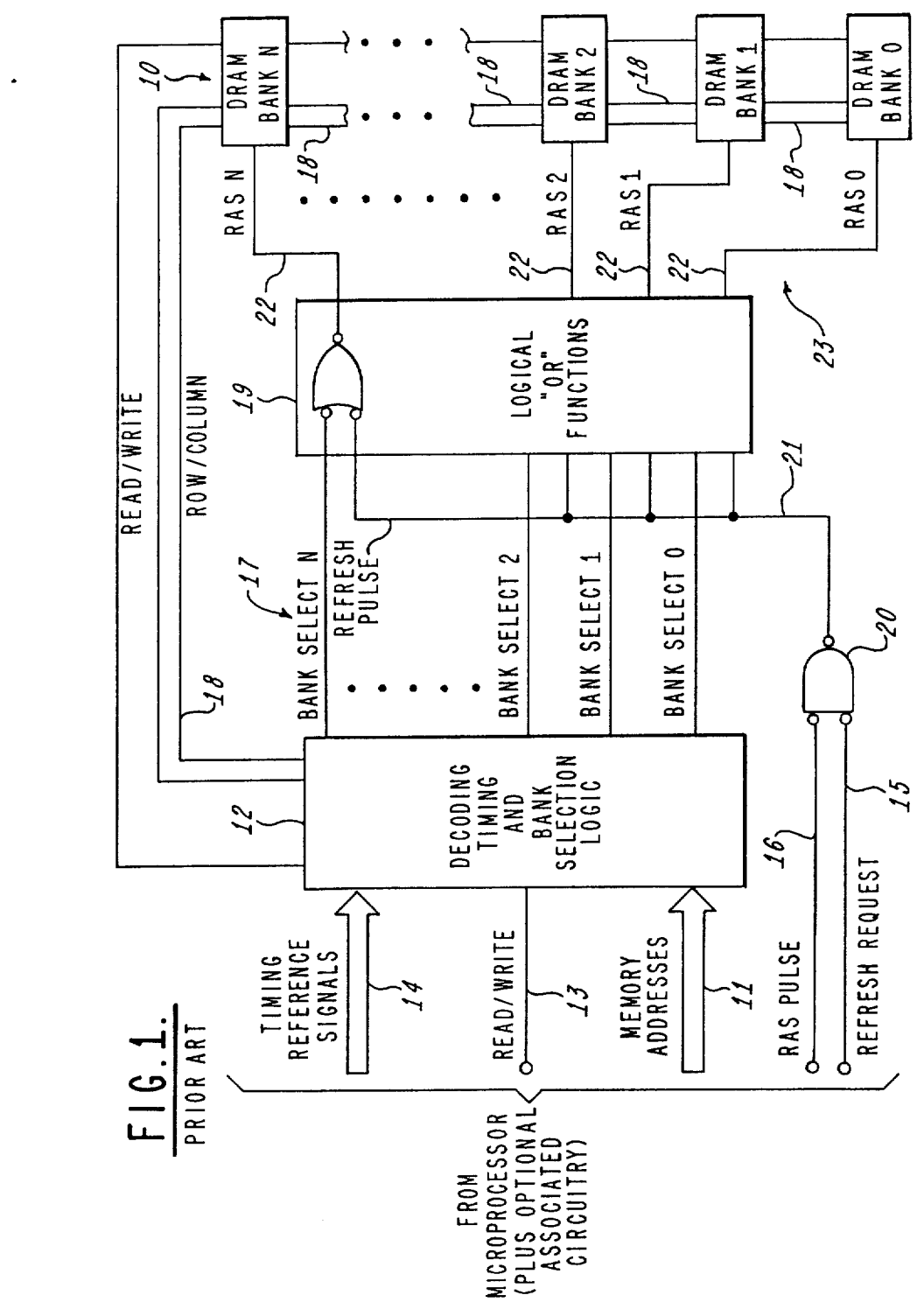
Figure 2:
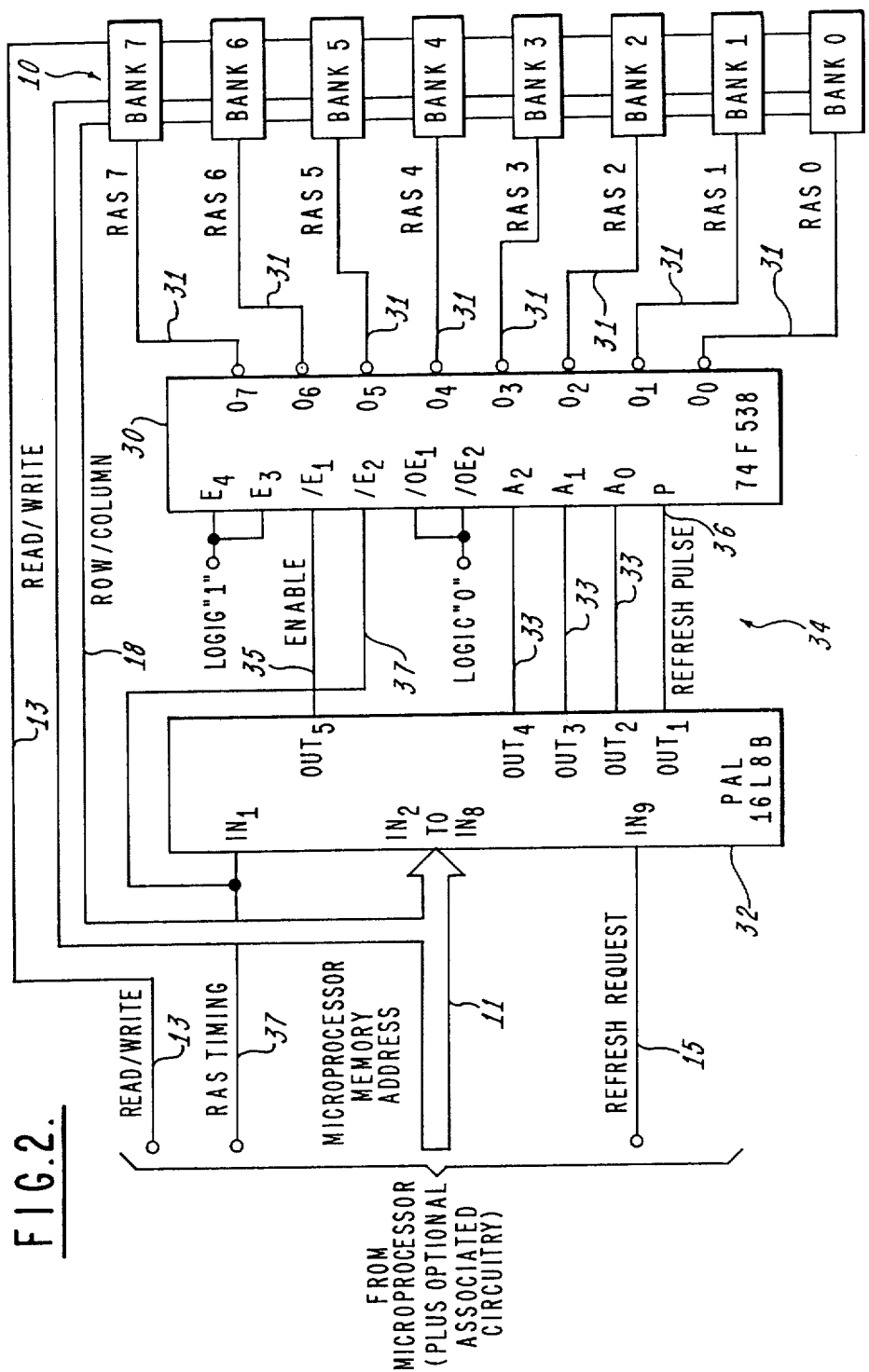
FIG. 2 is a schematic block diagram of the DRAM controller architecture implemented in accordance with the present invention.

Referring to FIG. 1, a prior art DRAM controller architecture is illustrated. A microprocessor (not shown) utilizes a DRAM array 10 organized into N+1 DRAM banks 0, 1, 2, . . . , N. The microprocessor provides memory addresses on a bus 11 to decoding, timing and bank selection logic circuits 12. The memory address on the bus 11 denotes the desired memory bank as well as the desired row and column address therein. The microprocessor also applies a read/write (R/W) signal on a line 13 to the circuits 12 to control the reading and writing operations with respect to memory access cycles. Timing signals for memory access are provided by the microprocessor to the circuits 12 via a bus 14. With respect to the refresh cycles, the microprocessor supplies a refresh request on a line 15 and a RAS pulse to effect the refresh timing on a line 16.

The circuits 12 apply the R/W signal on the line 13 to the banks of the memory array 10 to control the access cycles with respect to reading and writing. The circuits 12 also decode the memory addresses on the bus 11 to provide N+1 bank select signals 17 for enabling the respective N+1 banks of the memory array 10. In addition, the circuits 12 apply the appropriate row and column addresses to the memory array 10 via a bus 18.

The bank select lines 17 are applied to a refresh generating circuit 19 implemented by logical OR functions. The refresh request on the line 15 and the RAS pulse on the line 16 are combined in an AND function 20 to provide a refresh pulse on a line 21. The refresh pulse on the line 21 is applied with each of the bank select lines 17 to a logical OR function to provide N+1 RAS lines 22, respectively. The RAS lines 22 are denoted as RAS 0, RAS 1, RAS 2, ..., RAS N. The N+1 signal lines 22 collectively comprise a RAS signal bus 23. The elements 11-21 comprise the RAS control circuitry of the DRAM controller of the system. It is appreciated that the functionality represented by the elements 11-21 are located at the DRAM controller which is connected to the DRAM array 10 by the bus 23.

During a memory access cycle, the memory address on the bus 11 is decoded by the circuits 12 to energize the appropriate one of the bank select lines 17 and to apply the appropriate row and column addresses via the bus 18 to the array 10. The energized bank select line is transmitted through the refresh generating circuit 19 to energize the corresponding one of the RAS lines 22. During a refresh cycle, the refresh pulse on the line 21 is transmitted through the refresh generating circuit 19 and applied to all of the RAS lines 22 via the logical OR functions.

Referring to FIG. 2, in which like reference numerals indicate like elements with respect to FIG. 1, a DRAM controller implemented in accordance with the architecture of the present invention is illustrated. The architecture of the present invention utilizes modifications to the prior art architecture of FIG. 1 to overcome the disadvantages of the prior art. In the present invention, the refresh generating function is located at the memory array 10 rather than at the DRAM controller. The refresh generating function is implemented by an integrated circuit 30, in a manner to be explained. The integrated circuit 30 is preferably of the 538 type and specifically a 74F538. The embodiment of FIG. 2 is illustrated controlling eight DRAM banks 0-7. The outputs O0-O7 of the 74F538 integrated circuit 30 provide RAS lines 31 denoted as RAS 0-RAS 7 to the eight banks of dynamic RAM, respectively. It is appreciated that the RAS lines 31 are relatively short since the integrated circuit 30 is located at the memory array 10.

A further modification to the prior art architecture of FIG. 1 is the inclusion of RAS encoding circuitry at the DRAM controller and RAS decoding circuitry at the DRAM array 10. The RAS decoding circuitry is included in the 74F538 integrated circuit 30 and the RAS encoding circuitry is included in a programmable array logic (PAL) integrated circuit 32, in a manner to be explained. The PAL integrated circuit 32 is preferably implemented by a PAL16L8B integrated circuit. The RAS encoder circuitry in the PAL 32 in effect encodes the one out of N+1 bank select signals into a $\log_2(N+1)$ bit digital signal in a conventional manner. The RAS decoding circuitry in the 74F538 converts, in a conventional manner, the $\log_2(N+1)$ bit digital signal back into the N+1 RAS lines required to drive the DRAM array 10. The $\log_2(N+1)$ encoded RAS bits are transmitted from the PAL 32 to the integrated circuit 30 on lines 33 of a RAS signal bus 34. Thus, the addition of the RAS encoding and decoding circuitry in the PAL 32 and the integrated circuit 30 reduces the number of signal lines connected between the DRAM controller and the DRAM array 10. Whereas N+1 signal lines were previously required with respect to the prior art architecture of FIG. 1, the architecture of the present invention requires $[\log_2(N+1)+2]$ lines for the interconnecting bus. The two additional lines comprise an enable line 35 utilized to control the 74F538 and the refresh pulse signal, which is now routed to the DRAM array 10, on a line 36. The circuit of FIG. 2 is illustrated controlling eight banks of dynamic RAM. The number of signals associated with the RAS function is reduced from $N+1=8$ to $(\log_2 8)+2=5$. More significant decreases in the size of the bus 34 is achieved for larger arrays. For example, 16 signals are reduced to 6, 32 signals are reduced to 7, etc. It is appreciated that a significant cost reduction is effected by the architecture of the present invention since all of the DRAM controller circuitry is packaged into the single integrated circuit 32 while all of the circuitry at the DRAM array 10, except for the memory itself, is combined into the single integrated circuit 30.

The PAL 32 includes nine inputs IN1-N9 and five outputs OUT1-OUT5. The bank selection portion of the microprocessor memory addresses on the bus 11 is applied to IN2-IN8 and the refresh request signal on the line 15 is applied to IN9. A RAS timing signal from the microprocessor is applied on a line 37 to IN1. The row and column address portion of the memory addresses on the bus 11 are applied by the bus 18 to the memory array 10. The R/W signal from the microprocessor is also applied to the memory array 10 on the line 13.

The output OUT1 from the PAL 32 provides the refresh pulse on the line 36 in response to the refresh request on the line 15 and the RAS timing signal on the line 37. AND gate logic such as that described with respect to FIG. 1 may be implemented in the PAL 32 to this effect. This function will be further described with respect to the waveform timing diagram of FIG. 3. The output OUT5 of the PAL 32 provides the enable signal on the line 35 when the microprocessor requests a memory access cycle. The timing of the enable signal from the PAL 32 is illustrated and will be described further with respect to FIG. 3.

The PAL 32 is configured to implement the RAS encoding function for converting the bank selection portion of the microprocessor memory addresses applied to IN2-IN8 into the encoded RAS signals on the lines 33. As described above, the RAS signal bus 34 carries $\log_2(N+1)$ encoded RAS signals rather than the N+1 RAS signals otherwise required in the prior art. In a conventional manner, the PAL 32 includes latches to store the state of OUT2-OUT4 after the address line inputs to IN2-IN8 have changed state. The PAL 32 also includes conventional logic to generate the appropriately timed enable and refresh signals on the lines 35 and 36 to be further described with respect to FIG. 3. The PAL 32 may also be utilized to perform conventional address translation from the bank selection address on the bus 11 to selection of the physical memory bank. For example, translation of the location of each bank of memory to non-consecutive areas of the microprocessor address space may be implemented if desired. Thus, the PAL 32 may be utilized to qualify and translate the physical address space of the DRAM array 10 within the virtual address space of the microprocessor.

It is appreciated that the functionality driving the bus 34 is well suited to implementation with PAL logic. Thus, the PAL 32 functions as the encoder for the latched and encoded RAS signals on the lines 33, as latches to store the state of the signals after the address line inputs have changed state, and as logic which generates appropriately timed refresh and enable signals for the lines 35 and 36.

As described above, the 74F538 is applied to implement the RAS decoding and refresh-generating function for the circuit. The 74F538 includes a polarity control input P, inputs A0-A2, and enabling inputs /OE2,/OE1,/E2,/E1,E3 and E4. Enabling inputs E3 and E4 are permanently connected to logic level "1" while enabling inputs /OE1 and /OE2 are permanently connected to logic level "0". The enable signal on the line 35 is applied to the /E1 input for enabling and disabling the integrated circuit 30. In one embodiment of the invention, the /E2 input is permanently connected to logic level "0" and in another embodiment, /E2 is connected to receive the RAS timing signal on the line 37 for reasons to be discussed. The refresh pulse on the line 36 is applied to the P input of the integrated circuit 30 and the encoded RAS signals on the lines 33 from OUT2-OUT4 of the PAL 32 are applied to the inputs A0-A2, respectively, of the 74F538.

The 74F538 comprises an integrated circuit decoder with outputs O0-O7 selectable by the P input to perform positive or negative logic. When the circuit 30 is disabled, the outputs O0-O7 are inactive. When the circuit 30 is enabled, the output corresponding to the digital signal input at A0-A2 is rendered active. In the embodiment of the invention, where /E2 is connected to logic level "0" rather than to the RAS timing line 37, the 74F538 is enabled by applying logic level "0" to /E1 and disabled by applying logic level "1" thereto. In the embodiment of the invention where /E2 is connected to the RAS timing line 37 rather than to logic level "0", the 74F538 is enabled only when both the enable line 35 and the RAS timing line 37 are at logic level "0". When the polarity control input P of the circuit 30 is at logic level "0", the inactive state of the outputs O0-O7 is logic level "0". When the P input to the circuit 30 is at logic level level "1", the inactive state of the outputs O0-O7 are at logic level "1". The inactive state of the RAS lines with respect to the banks of the memory array 10 is logic level "1" while the active state thereof is logic level "0".

During a memory access cycle, the 74F538 is enabled and the refresh pulse input on the line 36 is at logic level "1". The inactive outputs O0-O7 are at logic level "1" with one of the outputs being driven to the active state of logic level "0" in accordance with the encoded digital RAS signal on the lines 33. Accordingly, an appropriate one of the memory array banks is selected for accessing. During a refresh cycle, the circuit 30 is disabled and the refresh pulse on the line 36 is at logic level "0" driving all of the outputs O0-O7 to logic level "0", thereby enabling the RAS lines RAS0-RAS7 to perform the refresh operation on the row in each of the banks of the array 10 selected by the row address on the bus 18.

Thus, it is appreciated that the 74F538 implements the RAS decoding function and the refresh-generating function for the circuit. The polarity control P of the 74F538 which, when activated by logic level "0", while the integrated circuit 30 is disabled (/E1=logic level "1"), causes all output signals (RAS0-RAS7) to be driven to logic level "0". Thus, the normal use of the polarity control causes the 74F538 to perform the refresh function.

As described above, in one embodiment of the invention, the /E2 input of the 74F538 is permanently connected to logic level "0" and the RAS timing signal on the line 37 is not applied thereto. In this embodiment, the propagation delay of a RAS signal on a line 31 from the input to the PAL 32 is the delay of the PAL 32 plus the delay of the 74F538. This propagation delay is approximately 25 nanoseconds when activating a RAS line 31 in a memory access cycle. In the described alternative embodiment of the invention, the /E2 input of the 74F538 is not connected to logic level "0". but is instead connected to receive the RAS timing on the line 37. Although this embodiment increases the number of signals to the 74F538 by one thus requiring an additional conductor on the bus 34, this embodiment decreases the RAS delay to approximately 10 nanosecond. This is because in the one embodiment, the RAS timing signal on the line 37 is utilized in the PAL 32 to generate the enable signal on the line 35 which in turn enables and disables the 74F538. In this embodiment, the propagation delays are additive. In the alternative embodiment, the RAS timing signal on the line 37 in combination with the enable signal on the line 35 enables and disables the 74F538 directly thereby eliminating the propagation delay of the PAL 32. Additionally, the RAS timing signal on the line 37 directly provides rising and falling edges to the 74F538 for accurate generation of the RAS strobes on the lines 31 during memory access cycles.

Although the invention was explained in terms of a PAL for implementing the functionality at the input to the bus 34 and a 538 integrated circuit for implementing the functionality at the output of the bus 34, alternative arrangements may be utilized in practicing the invention. For example, discrete logic may be utilized instead of the PAL 32 in implementing the functionality. In addition, instead of the integrated circuit 30, a decoder may be utilized responsive to the encoded RAS signal on the lines 33 as well as the enable signal on the line 35. The outputs of the decoder provide the bank select signals that are in turn applied to a refresh generating circuit such as the circuit 19 of FIG. 1. The refresh generating circuit is also responsive to the refresh pulse on the line 36. The output of the refresh generating circuit then provides the RAS lines 31.

With respect to the arrangement utilizing the separate decoder and refresh generating circuit instead of the integrated circuit 30, a further embodiment of the invention may be realized. In this embodiment, it is possible to eliminate the refresh pulse line 36 from the bus 34 by utilizing one of the states of the encoded RAS signals on the lines 33 for generating the refresh pulse instead of for bank selection. This state, in combination with a valid enable signal, is utilized to indicate a refresh condition. The bank selection line from the decoder corresponding to the state is applied to all of the OR functions in the refresh generating circuit so as to provide the refresh operation to the DRAM array 10. This alternative embodiment may be useful in controlling a number of RAS lines not equal to an integral power of 2.

Figure 3:
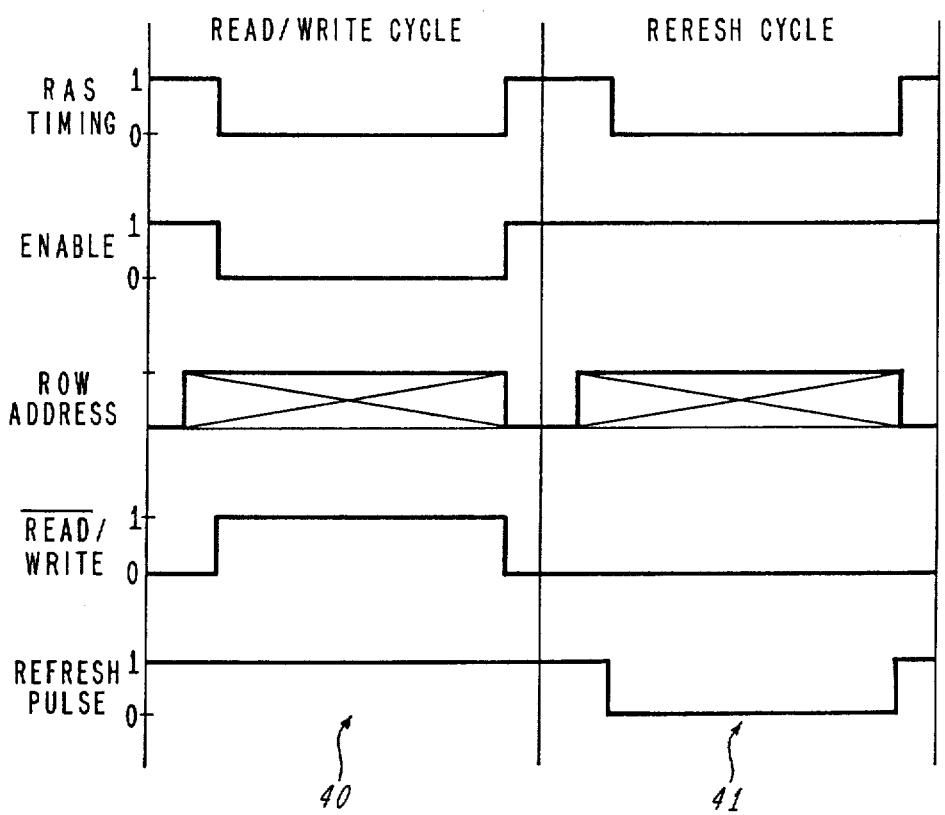
FIG. 3 is a waveform timing diagram illustrating control signals for the read/write memory access cycle and refresh cycle of the DRAM controller of FIG. 2.

Referring to FIG. 3, a timing diagram illustrating waveforms appearing in FIG. 2 is illustrated. FIG. 3 illustrates a read/write or memory access cycle 40 and a refresh cycle 41. During a memory access cycle 40, the row address is applied by the microprocessor and when the address signals have settled, the enable pulse is activated in response to the RAS timing signal. An appropriate read or write signal is generated and the RAS pulse on the RAS line 31 corresponding to the row address is generated. During the memory access cycle 40, the refresh pulse remains inactive. In the embodiment of the invention, where the RAS timing line 37 is connected to the /E2 input of the 74F538, the edges of the RAS timing pulse provides the timing for the RAS strobe generated on the selected line 31. Since both the enable signal and the RAS timing signal are active during the memory access cycle 40, the 74F538 is enabled during the time when both of these signals are active.

During the memory access cycle for the embodiment of the invention illustrated, the read-not/write signal is logic "0" during read and logic "1" during write. This signal should be logic "0" (read state) during refresh. It is appreciated that alternatively the read/write signal polarity may be reversed from that described to the same effect.

During a refresh cycle 41, the row address of the rows to be refreshed is provided by the microprocessor. When the row address signals have settled, the refresh pulse is rendered active simultaneously enabling all of the RAS lines 31 to effect the refresh operation. The enable signal remains inactive and therefore the 74F538 remains disabled during the refresh cycle 41. The toggling of the RAS timing signal has no effect on the 74F538 during the refresh cycle, because the enable signal is inactive.

The present invention provides RAS bank select signals for large arrays of DRAM at low cost. The invention provides a DRAM controller architecture that minimizes the number of electrical signals connected between the memory controller circuit and the DRAM array. This architecture advantageously decreases circuit cost by decreasing the number of electrical interconnections or I/O pins from an integrated circuit designed to drive the DRAMs and by decreasing the size; i.e., the number of signals, of the electrical bus connecting the memory array with the controller circuitry. Additionally, the architecture of the present invention may be implemented with fewer components than conventional designs resulting in lower cost and less physical space required for the circuit. The PAL 32 and the integrated circuit 30 replaces the functionality provided by numerous separate integrated circuits when using conventional architecture. The invention provides very fast propagation delay of the critical timing signals. Thus, the architecture of the present invention is particularly suitable for high speed circuits.

The present invention is described in terms of refreshing the DRAM array 10 by sequential rows which is the usual arrangement. It is appreciated, however, that other refresh configurations may also be utilized in practicing the invention. For example, the memory array may be refreshed by a technique referred to as "CAS-before-RAS" in which the refresh cycle comprises a CAS pulse followed by a RAS pulse. Typically, both pulses are provided to all banks or to large groups of banks. In this refresh mode, a refresh address is not generated. The DRAMs internally generate the appropriate sequential addresses with each refresh cycle.

While the invention has been described in its preferred embodiment, it is to be understood that the words which have been used are words of description rather than limitation and that changes may be made within the purview of the appended claims without departing from the true scope and spirit of the invention in its broader aspects.

I claim:

1. DRAM controller apparatus for use with a DRAM array having a plurality of banks, each said bank having a coordinate address strobe input, said controller being responsive to a memory address signal for selecting one of said banks, said memory being operative in a memory access cycle wherein one of said banks is selected by selectively actuating said coordinate address strobe input thereof and a refresh cycle for refreshing said DRAM array in response to a refresh request signal by simultaneously actuating said coordinate address strobe inputs of all said banks, comprising
   first circuit means including encoding means responsive to said memory address signal for providing an encoded digital coordinate address strobe signal representative of said selected bank and having a number of bits smaller than the number of said banks,
   second circuit means including decoding means and polarity inverting means, and
   bus means for coupling said encoded digital coordinate address strobe signal from said first circuit means to said second circuit means,
   said decoding means comprising means having a plurality of outputs coupled respectively to said coordinate address strobe inputs of said banks and responsive to said encoded digital coordinate address strobe signal for selectively energizing one of said outputs in accordance therewith, thereby selecting said bank corresponding to said encoded digital coordinate address strobe signal,
   said polarity inverting means comprising means responsive to said refresh request signal for simultaneously inverting the polarity of all of said outputs, thereby effecting said refresh cycle.

2. The apparatus of claim 1 wherein said second circuit means is located at said DRAM array.

3. The apparatus of claim 1 wherein
   said coordinate address strobe input comprises a RAS input, and
   said encoded digital coordinate address strobe signal comprises an encoded digital RAS signal.

4. The apparatus of claim 3 wherein
   said decoding means includes an output to which said polarity inverting means is responsive,
   said encoded digital RAS signal includes a state representative of said refresh request signal,
   said output to which said polarity inverting means is responsive being energized in response to said state of said digital RAS signal representative of said refresh request signal.

5. The apparatus of claim 1 wherein said second circuit means includes means for selectively enabling and disabling said second circuit means, said decoder means being operative when said second circuit means is enabled and said polarity inverting means being operative when said second circuit mean is disabled.

6. The apparatus of claim 5 wherein said first circuit means includes means for providing an enable signal to an enabling input of said second circuit means for enabling said second circuit means during said memory access cycles and for disabling said second circuit means during said refresh cycles.

7. The apparatus of claim 6 wherein said bus means includes means for coupling said enable signal from said first circuit means to said second circuit means.

8. The apparatus of claim 6 wherein said first circuit xeans includes means responsive to a timing signal for generating said enable signal,
  said timing signal being applied to a further enabling input of said second circuit means so that said second circuit means is enabled upon the simultaneous occurrence of said timing signal and said enable signal.

9. The apparatus of claim 8 wherein said bus means includes means for coupling said enable signal and said timing signal from said first circuit means to said second circuit means.

10. The apparatus of claim 4 wherein said first circuit means comprises a first integrated circuit.

11. The apparatus of claim 10 wherein said first integrated circuit comprises a programmable array logic (PAL) integrated circuit.

12. The apparatus of claim 11 wherein said PAL comprises a PAL16L88 integrated circuit.

13. The apparatus of claim 11 wherein said second circuit means comprises a second integrated circuit.

14. The apparatus of claim 13 wherein said second integrated circuit comprises a 538 type integrated circuit.

15. The apparatus of claim 14 wherein said 538 type integrated circuit comprises a 74F538 integrated circuit.

16. The apparatus of claim 14 wherein
  said 538 type integrated circuit includes a polarity control (P) input,
  said PAL includes means for generating a refresh pulse in response to said refresh request signal, and
  said bus means includes means for coupling said refresh pulse from said PAL to said P input.

* * * * *